(12) United States Patent
Ito et al.

(10) Patent No.: US 7,193,020 B2
(45) Date of Patent: Mar. 20, 2007

(54) FILM AND LAMINATE OF THE SAME

(75) Inventors: Toyonari Ito, Tsukuba (JP); Satoshi Okamoto, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 11/137,374

(22) Filed: May 26, 2005

(65) Prior Publication Data

US 2005/0266233 A1 Dec. 1, 2005

(30) Foreign Application Priority Data

May 28, 2004 (JP) .............................. 2004-158828
Dec. 22, 2004 (JP) .............................. 2004-370729

(51) Int. Cl.
*B32B 27/36* (2006.01)
*B32B 37/15* (2006.01)
*C08L 63/03* (2006.01)
*C08L 67/04* (2006.01)
*C08L 79/08* (2006.01)

(52) U.S. Cl. ..................... 525/420; 525/419; 525/425; 525/180; 525/437; 525/439; 528/288; 528/292; 528/302; 528/308; 528/308.6; 528/310; 528/332; 428/473.5; 428/480; 427/331; 427/372.2; 427/384; 427/385.5

(58) Field of Classification Search ..................... None
See application file for complete search history.

(56) References Cited

U.S. PATENT DOCUMENTS

| 5,171,778 | A | * | 12/1992 | Dekkers et al. ............. 524/539 |
|---|---|---|---|---|
| 5,231,162 | A | * | 7/1993 | Nagata ........................ 528/353 |
| 5,288,519 | A | * | 2/1994 | Baumgartner et al. ....... 427/304 |
| 5,312,866 | A | * | 5/1994 | Tsutsumi et al. ............. 524/600 |
| 5,321,096 | A | * | 6/1994 | Okawa et al. ................ 525/420 |
| 5,324,475 | A | * | 6/1994 | Okahashi et al. ............. 264/555 |
| 5,346,969 | A | * | 9/1994 | Kaku ............................ 525/432 |
| 5,438,105 | A | * | 8/1995 | Nagata ........................ 525/436 |
| 5,470,922 | A | * | 11/1995 | Kaku et al. .................. 525/436 |
| 5,516,837 | A | * | 5/1996 | Tsutsumi et al. ............. 524/600 |
| 5,571,875 | A | * | 11/1996 | Tsutsumi et al. ............. 525/425 |
| 5,700,863 | A | * | 12/1997 | Bloom ........................ 524/406 |
| 5,789,523 | A | * | 8/1998 | George et al. ............... 528/170 |
| 5,789,524 | A | * | 8/1998 | Hsu et al. .................... 528/170 |
| 5,981,007 | A | * | 11/1999 | Rubin et al. ................ 428/35.5 |
| 6,277,495 | B1 | * | 8/2001 | Sawasaki et al. ............ 428/458 |
| 2002/0049270 | A1 | * | 4/2002 | Okamoto et al. ............ 524/341 |
| 2002/0111415 | A1 | * | 8/2002 | Mack et al. ................. 524/496 |
| 2002/0130103 | A1 | * | 9/2002 | Zimmerman et al. ......... 216/27 |
| 2002/0162218 | A1 | * | 11/2002 | Skorupski et al. ............ 29/847 |
| 2003/0193039 | A1 | * | 10/2003 | Okamoto et al. ....... 252/299.67 |
| 2004/0091686 | A1 | * | 5/2004 | Okamoto et al. ............ 428/209 |
| 2004/0152865 | A1 | * | 8/2004 | Okamoto et al. ............ 528/302 |
| 2004/0247907 | A1 | * | 12/2004 | Goda et al. ............... 428/473.5 |

FOREIGN PATENT DOCUMENTS

| EP | 0 430 640 A1 | * | 6/1991 |
|---|---|---|---|
| JP | 58-190093 A | | 11/1983 |
| JP | 63-021115 | * | 1/1988 |
| JP | 11-227099 | * | 8/1999 |

* cited by examiner

*Primary Examiner*—Vivian Chen
(74) *Attorney, Agent, or Firm*—Sughrue Mion, PLLC

(57) ABSTRACT

A film comprising a resin alloy of a liquid-crystalline polyester, a polyimide and an optional inorganic filler is provided. The film is excellent in heat resistance and dimensional stability.

15 Claims, No Drawings

FILM AND LAMINATE OF THE SAME

BACKGROUND OF THE INVENTION

1. Field of the Invention

The present invention relates to a film and a laminate using the film.

2. Description of the Related Art

A polyimide film has been employed as an electric insulation film in laminate for flexible wiring board. For example, a laminate in which a conductor layer such as metallic foil and a polyimide film are laminated directly with each other or with an adhesive therebetween (see, Japanese Patent Application Laid-Open No. 58-190093).

However, the conventional polyimide film is insufficient in heat resistant and dimensional stability.

A method for producing a laminate in which a polyimide film is directly laminated on a conductor layer, has also been known. In the method, the laminate has been obtained by applying a solution of a polyimide precursor and a solvent onto a conductor layer and removing the solvent (see, "Latest polyimide—Basics and Applications—" edited by Japanese Polyimide Study Group, page 549 (2002)).

The polyimide laminate obtained by such a method, however, is insufficient in dimensional stability, since the polyimide film therein sometimes has a curled shape.

SUMMARY OF THE INVENTION

One of objects of the present invention is to provide a film which is excellent in heat resistance and dimensional stability and can provide a laminate thereof with less curled shape.

The present inventors have studied on components of a film. As a result, it has been found that a film comprising a resin alloy of a liquid-crystalline polyester and a polyimide is excellent in heat resistance and dimensional stability, and can provide a less curled laminate. The present invention has been accomplished based on the findings.

The present invention provides a film comprising a resin alloy (or polymer alloy) of a liquid-crystalline polyester and a polyimide, and also provides a method for producing the film.

Further, the present invention provides a liquid composition for preparing the film, the composition comprising a liquid-crystalline polyester, a polyamic acid and an organic solvent.

Moreover, the present invention provides a laminate of the film.

A film of the present invention has high heat resistance and high dimensional stability with low linear expansion coefficient. A laminate comprising the film of the present invention is also excellent in dimensional stability, in which the film has a less curled shape. Such a film of the present invention and the laminate comprising the film can be utilized in electric and electronic fields, for example, in a flexible wiring board (FPC), a film carrier, a high-density magnetic tape material, an electric-wire coating agent, a film condenser and the like.

A film of the present invention comprises a resin alloy of a liquid-crystalline polyester and a polyimide. A "resin alloy" is a multicomponent polymer containing two or more kinds of polymers. The resin alloy may be a polymer blend or may be a polymer in which at least a portion of two or more kinds of polymers are linked between them.

The liquid-crystalline polyester used in the present invention may be a thermotropic liquid-crystalline polymer and may form a melt exhibiting optical anisotropy at a temperature of 450° C. or lower.

Examples of the liquid-crystalline polyester include the following polyesters:

(1) a polyester comprising a repeating unit derived from an aromatic hydroxycarboxylic acid, a repeating unit derived from an aromatic dicarboxylic acid and a repeating unit derived from an aromatic diol;

(2) a polyester comprising repeating units derived from the same or different kinds of aromatic hydroxycarboxylic acids;

(3) a polyester comprising a repeating unit derived from an aromatic dicarboxylic acid and a repeating unit derived from an aromatic diol;

(4) a polyester prepared by reacting an aromatic hydroxycarboxylic acid with a crystalline polyester such as polyethylene terephthalate.

(5) a polyester comprising a repeating unit derived from an aromatic hydroxycarboxylic acid, a repeating unit derived from an aromatic dicarboxylic acid and a repeating unit derived from an aromatic amine with a phenolic hydroxyl group;

(6) a polyester comprising a repeating unit derived from an aromatic dicarboxylic acid and a repeating unit derived from an aromatic amine with a phenolic hydroxyl group;

(7) a polyester comprising a repeating unit derived from an aromatic hydroxycarboxylic acid, a repeating unit derived from an aromatic dicarboxylic acid and a repeating unit derived from an aromatic diamine;

(8) a polyester comprising a repeating unit derived from an aromatic dicarboxylic acid and a repeating unit derived from an aromatic diamine.

It is noted that the liquid-crystalline polyester in the present invention include the above-mentioned polyester (8), even though polyester (8) in general may be called polyamide.

In the present invention, the above-mentioned polyesters (5), (6), (7) and (8) are preferably used, since the resulting film has high heat resistance and high dimensional stability.

In preparing the above-mentioned polyesters, the aromatic hydroxycarboxylic acid, the aromatic dicarboxylic acid, the aromatic diol and/or the aromatic amine with a phenolic hydroxyl group may be used in the form of ester-forming derivative or in the form of amide-forming derivative.

The ester-forming or amide-forming derivative may be an aromatic hydroxycarboxylic acid derivative or an aromatic dicarboxylic acid derivative, the carboxyl group of which forms a highly reactive derivative (such as chloride and anhydride) which can promote a polyester-producing reaction or a polyamide-producing reaction; or the carboxyl group of which forms an ester or amine with an alcohol, ethylene glycol or amine to provide a polyester by transesterification or a polyamide by amide-exchange reaction.

The ester-forming derivative may be an aromatic diol derivative, the phenolic hydroxyl group of which forms an ester with a carboxylic acid to provide a polyester by transesterification.

The amide-forming derivative may be an aromatic amine derivative, the amino group of which forms an amide with a carboxylic acid to provide an amide by amide-exchange reaction.

As long as the ester-forming or amide-forming property is not deteriorated, the aromatic hydroxycarboxylic acid, the aromatic dicarboxylic acid, the aromatic diol, the aromatic amine with a phenolic hydroxyl group and the aromatic diamine may be substituted with at least one substituent. Examples of the substituent include a halogen atom (e.g. a chlorine atom, a fluorine atom, etc.), an alkyl group (e.g. a methyl group, an ethyl group, etc.) and an aryl group (e.g. a phenyl group, etc.).

Examples of the repeating unit in the aromatic liquid-crystalline polyester include the following units, which are not limited to:

Repeating units derived from aromatic hydroxycarboxylic acids as follows:

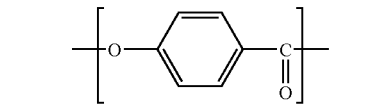
(A₁)

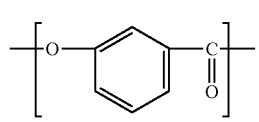
(A₂)

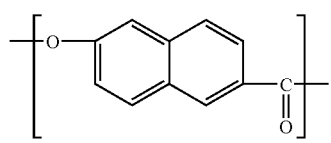
(A₃)

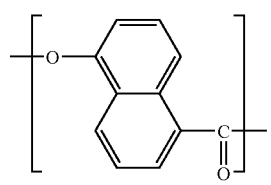
(A₄)

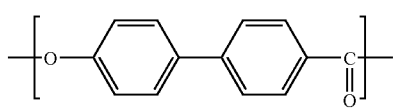
(A₅)

Repeating units derived from aromatic dicarboxylic acids as follows:

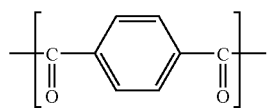
(B1)

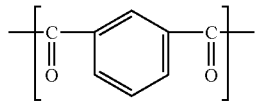
(B2)

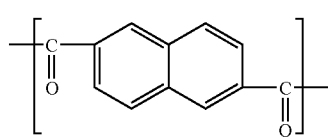
(B3)

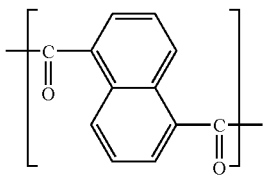
(B4)

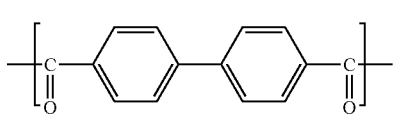
(B5)

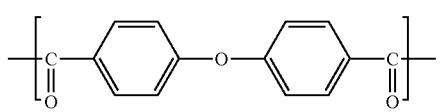
(B6)

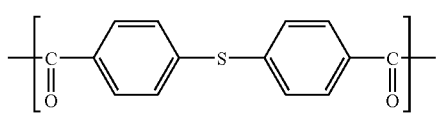
(B7)

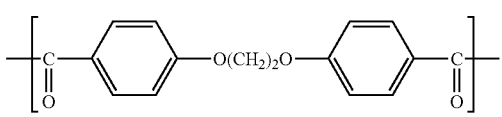
(B8)

Repeating units derived from aromatic diols as follows:

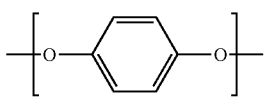
(C₁)

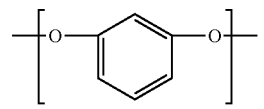
(C₂)

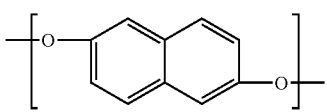
(C₃)

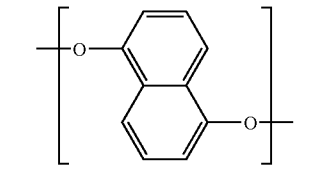
(C₄)

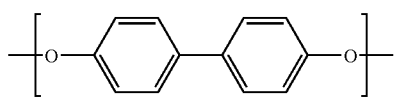
(C₅)

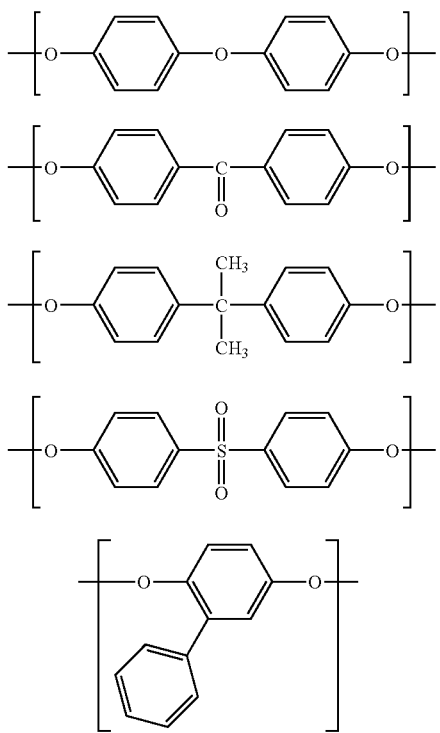
Repeating units derived from aromatic amines having phenolic hydroxyl groups as follows:
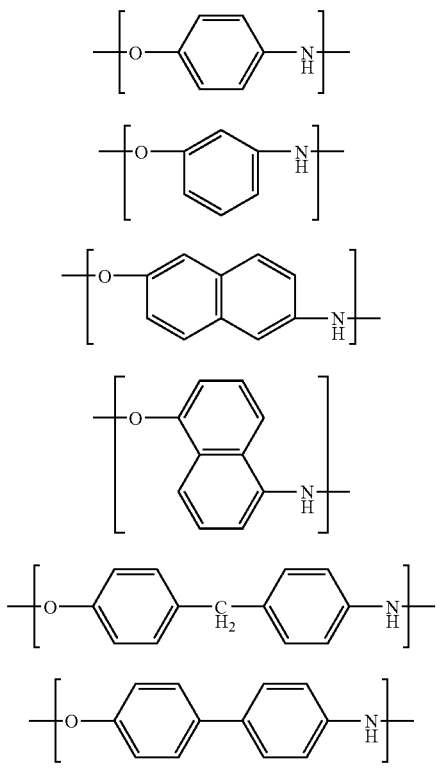
Repeating units derived from aromatic diamine as follows:
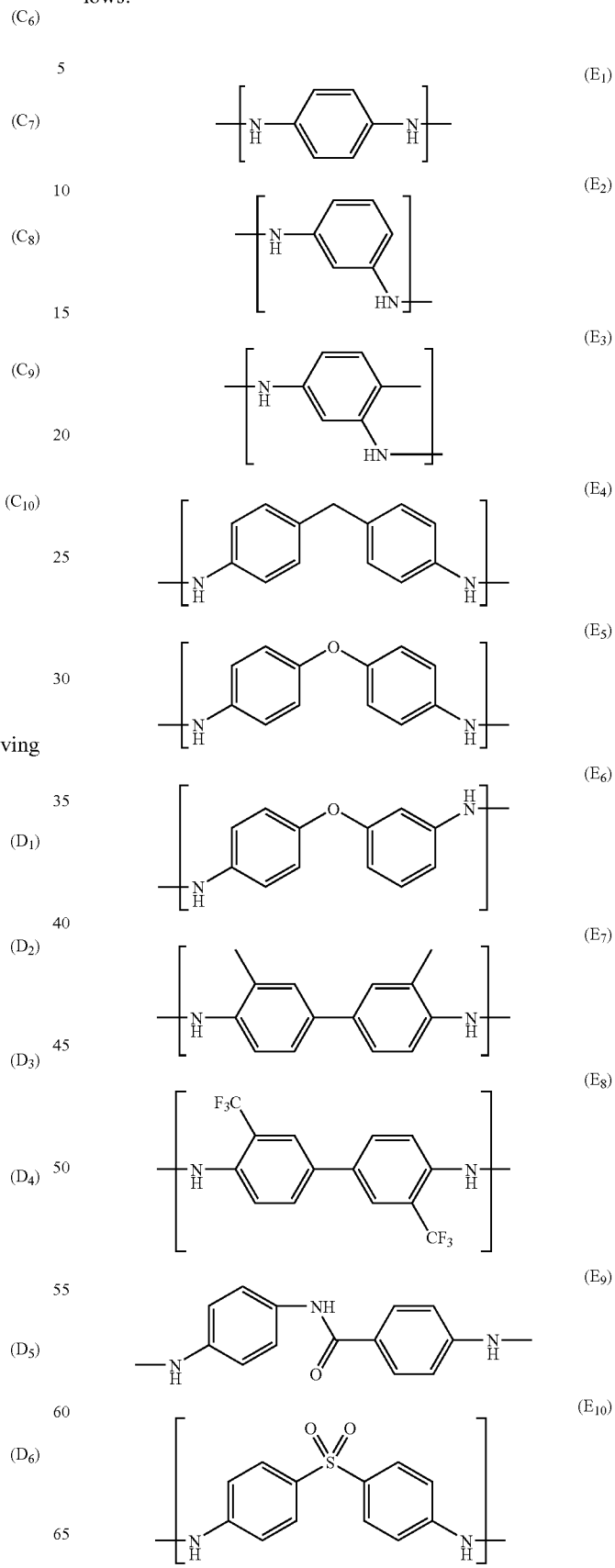

-continued

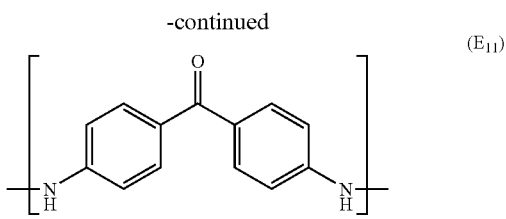
(E₁₁)

Each of the above repeating units derived from aromatic hydroxycarboxylic acids, aromatic dicarboxylic acids, aromatic diols, aromatic amines having phenolic hydroxyl groups and aromatic diamines may have a substituent such as a halogen atom, an alkyl group, an aryl group or the like.

Preferably, the alkyl group as a substituent has 1 to 10 carbon atoms, and the above aryl group has 6 to 20 carbon atoms. Specific examples of the preferable alkyl group include a methyl group, an ethyl group, a propyl group and a butyl group, etc., and specific examples of the preferable aryl group include a phenyl group, etc.

In addition, the liquid-crystalline polyester in the present invention preferably contain any of the repeating units represented by formula ($A_1$), ($A_3$), ($B_1$), ($B_2$) and ($B_3$) shown above, from the viewpoint of properties (such as thermal resistance and dimensional stability) of the resulting film with a good balance in the properties.

Preferable combinations of the repeating units are the combinations (a), including (a)-1 to (a)-5, to (d) as follows:

(a)-1: a combination of ($A_1$), ($B_2$) and ($D_1$),
(a)-2: a combination of ($A_3$), ($B_2$) and ($D_1$),
(a)-3: a combination of ($A_1$), ($B_1$), ($B_2$) and ($D_1$),
(a)-4: a combination of ($A_3$), ($B_1$), ($B_2$) and ($D_1$),
(a)-5: a combination of ($A_3$), ($B_3$) and ($D_1$),
(a)-6: a combination of ($B_1$), ($B_2$) and ($D_1$),
(a)-7: a combination of ($B_1$), ($B_3$) and ($D_1$),
(b): a combination in which a part or all of ($D_1$) in each of combination selected from the combinations (a)-1 to (a)-7 is replaced by ($D_2$),
(c): a combination in which a part or all of ($A_1$) in each of combination selected from the combinations (a)-1 to (a)-7 is replaced by ($A_3$), and
(d): a combination in which a part or all of ($D_1$) in each of combination selected from the combinations (a)-1 to (a)-7 is replaced by ($E_1$) or ($E_5$).

In addition, it is preferred that the liquid-crystalline polyester used in the invention comprises 30 to 80% by mole of a repeating unit derived from at least one compound selected from the group consisting of p-hydroxybenzoic acid and 2-hydroxy-6-naphthoic acid, 10 to 35% by mole of a repeating unit derived from at least one compound selected from the group consisting of 4-hydroxy aniline and 4,4'-dianimo-diphenylether and 10 to 35% by mole of a repeating unit derived from at least one compound selected from the group consisting of terephthalic acid and isophthalic acid. More preferably, the liquid-crystalline polyester used in the invention comprises 30 to 80% by mole of a repeating unit derived from 2-hydroxy-6-naphthoic acid, 10 to 35% by mole of a repeating unit derived from 4-hydroxyaniline and 10 to 35% by mole of a repeating unit derived from isophthalic acid.

The weight-average molecular weight of the liquid-crystalline polyester in the invention is not limited, and may be in the range of from about 10,000 to about 500,000. The weight-average molecular weight is preferably in the range of from about 100,000 to about 500,000.

The method for producing a liquid-crystalline polyester in the present invention is not particularly limited. Examples of the method includes a method in which at least one compound selected from the group consisting of an aromatic hydroxycarboxylic acid, an aromatic diol, an aromatic amine having a phenolic hydroxyl group and an aromatic diamine is acylated with an excessive amount of an aliphatic carboxylic anhydride to obtain an acylated compound, and then the acylated compound is subjected to a transesterification and amide exchange with at least one compound selected from the group consisting of an aromatic hydroxycarboxylic acid and/or an aromatic dicarboxylic acid, to conduct polymerization.

In the acylation process, the amount of the aliphatic carboxylic anhydride is preferably from 1 to 1.2 equivalents, more preferably from 1.05 to 1.1 equivalents, per one equivalent of the total amount of the phenolic hydroxyl group and amino group.

When the amount of the aliphatic carboxylic anhydride is less than the above lower limit, the acylated compound, the aromatic hydroxycarboxylic acid, the aromatic dicarboxylic acid, etc. tend to sublimate during the transesterification or and/or amide exchange so that pipes or the like of a reactor may be clogged. When the amount of the aliphatic carboxylic anhydride exceeds the above upper limit, the liquid-crystalline polyester obtained tends to be noticeably colored.

The acylation is preferably carried out at a temperature of 130 to 180° C. for 5 minutes to 10 hours, more preferably at a temperature of 140 to 160° C. for 10 minutes to 3 hours.

The kind of the aliphatic carboxylic anhydride used for acylation is not limited. Examples of the aliphatic carboxylic anhydride include acetic anhydride, propionic anhydride, butyric anhydride, isobutyric anhydride, valeric anhydride, pivalic anhydride, 2-ethylhexanoic anhydride, monochloroacetic anhydride, dichloroacetic anhydride, trichloroacetic anhydride, monobromoacetic anhydride, dibromoacetic anhydride, tribromoacetic anhydride, monofluoroacetic anhydride, difluoroacetic anhydride, trifluoroacetic anhydride, glutaric anhydride, maleic anhydride, succinic anhydride, β-bromopropionic anhydride, etc. These anhydrides may be used independently or in admixture of two or more of them.

Among them, acetic anhydride, propionic anhydride, butyric anhydride and isobutyric anhydride are preferable from the viewpoint of their costs and handling properties. More preferably, acetic anhydride is used.

In the transesterification and amide exchange, the acylated compound is preferably used in such an amount that the equivalent of the acyl group is 0.8 to 1.2 times the equivalent of the carboxyl group.

The transesterification and amide exchange are preferably carried out in a temperature range between 130 and 400° C., more preferably carried out in a temperature range between 150 and 350° C., while preferably raising a temperature at a rate of 0.1 to 50° C./min., more preferably raising a temperature at a rate of 0.3 to 5° C./min.

The unreacted aliphatic carboxylic anhydride and by-produced carboxylic acids are preferably removed from the reaction system by, for example, evaporation to shift the equilibrium in reaction to the product side during the transesterification and amide exchange.

Any of the acylation reaction, transesterification and amide exchange may be carried out in the presence of a catalyst.

The catalyst may be a conventional catalyst used as a polymerization catalyst for polyester. Examples of the catalyst include metal salt catalysts (e.g. magnesium acetate, stannous acetate, tetrabutyl titanate, lead acetate, sodium acetate, potassium acetate, antimony trioxide, etc.), organic compound catalysts (e.g. N,N-dimethylaminopyridine, N-methylimidazole, etc.) and so on.

The catalyst may be added to a reactor when the reactor is charged with the monomers. The catalyst used in the acylation, transesterification and amide exchange are not necessarily removed, and the reaction mixture with the catalyst may be subjected to the following reaction(s). In the following reaction(s), an additional catalyst may be further added thereto.

The polycondensation through transesterification and/or amide exchange may be carried out by melt-polymerization, which may be followed by solid-phase polymerization.

When the solid-phase polymerization is conducted, the polymer from the melt-polymerization is preferably milled to obtain the powder-form or flake-form polymer, which is then subjected to a conventional solid-phase polymerization.

Specifically, the solid-phase polymerization can be conducted so that the polymer in the solid state from the melt-polymerization is heated in an atmosphere of an inert gas such as nitrogen at a temperature of 20 to 350° C. for 1 to 30 hours.

The solid-phase polymerization may be carried out with or without agitating the polymer. When a reactor equipped with a suitable agitation mechanism is utilized, the melt-polymerization and the solid-phase polymerization can be carried out in the same reactor.

After the solid-phase polymerization, the liquid-crystalline polyester obtained may be pelletized in a conventional manner and then molded or shaped.

The liquid-crystalline polyester may be produced batch-wise or continuously.

A polyimide in the present invention can be produced using a tetracarboxylic acid dianhydride represented by formula (a3) below and a diamine represented by formula (a4) below.

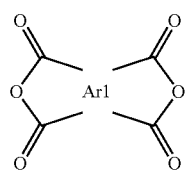
(a3)

(a4)

wherein Ar1 and Ar2 independently represent groups comprising aromatic and/or alicyclic rings.

Ar1 is a quadrivalent group, in which two or more aromatic and/or alicyclic rings may be polycondensed or may be linked directly or indirectly with one another.

Examples of the tetracarboxylic acid dianhydride represented by formula (a3) include the following compounds represented by formulas ($F_1$) to ($F_{11}$):

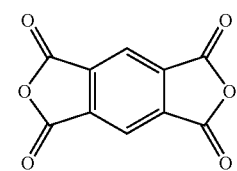
($F_1$)

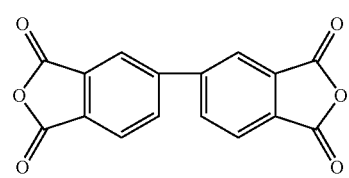
($F_2$)

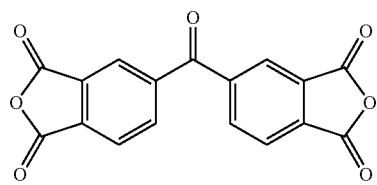
($F_3$)

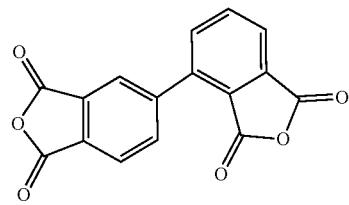
($F_4$)

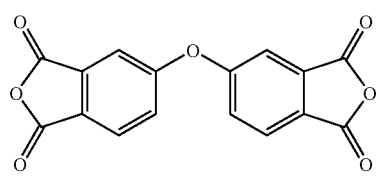
($F_5$)

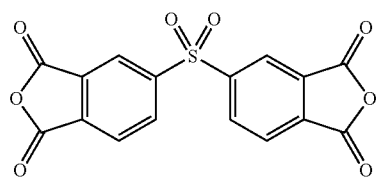
($F_6$)

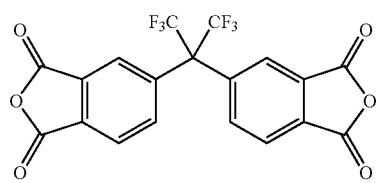
($F_7$)

-continued

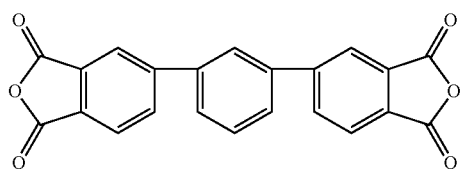
(F8)

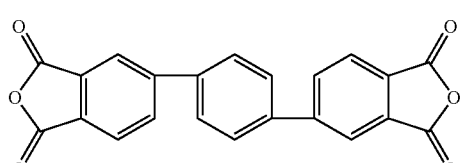
(F9)

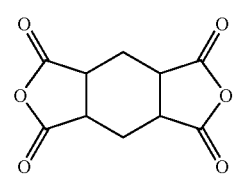
(F10)

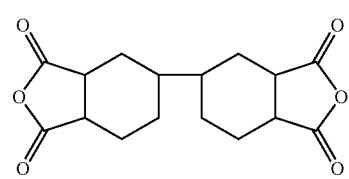
(F11)

These compounds represented by formulas (F$_1$) to (F$_{11}$) may be used independently or in admixture of two or more of them.

Ar2 is a divalent group, in which two or more aromatic and alicyclic rings may be polycondensed or may be linked directly or indirectly with one another.

Examples of the diamine represented by formula (a4) include the following compounds represented by formulas (G$_1$) to (G$_{13}$):

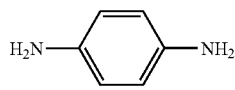
(G1)

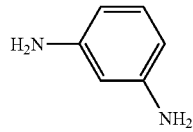
(G2)

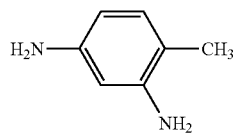
(G3)

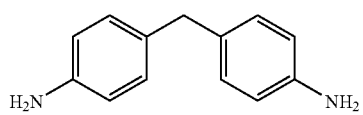
(G4)

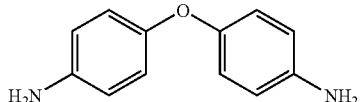
(G5)

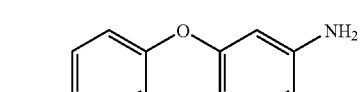
(G6)

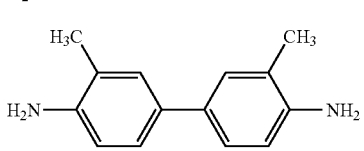
(G7)

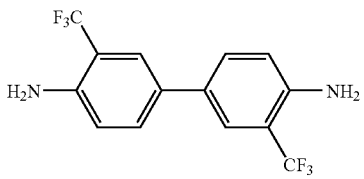
(G8)

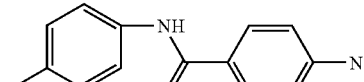
(G9)

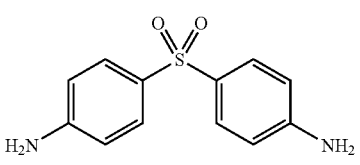
(G10)

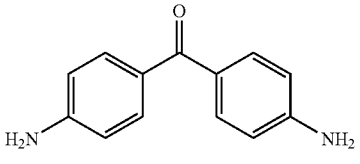
(G11)

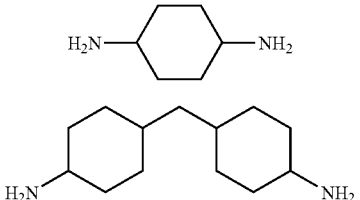
(G12)

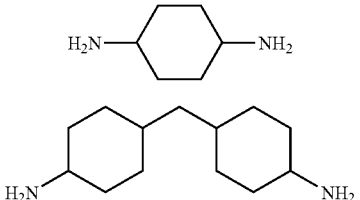
(G13)

These compounds represented by formulas (G$_1$) to (G$_{13}$) may be used independently or in admixture of two or more of them.

In view of producing a film having properties (such as thermal resistance and dimensional stability) with a good balance in the properties, preferable combinations of the tetracarboxylic acid dianhydride and the diamine (for providing a polyimide in the present invention) are the combinations (e) to (k) as follows:

(e): a combination of (F$_1$) and (G$_1$),
(f): a combination of (F$_1$) and (G$_5$),
(g): a combination of (F$_2$) and (G$_1$),
(h): a combination of (F$_2$) and (G$_5$), (i): a combination in which a part of $(F_1)$ in each of combination selected from the combinations (e) and (f) is replaced by $(F_2)$, and (j): a combination in which a part of $(G_1)$ in each of combination selected from the combinations (e) and (g) is replaced by $(G_5)$.

(k): a combination in which a part of $(F_1)$ and a part of $(G_1)$ in the combination (e) is replaced by $(F_2)$ and (Gs), respectively.

As mentioned above, a polyimide in the present invention may be produced using a tetracarboxylic acid dianhydride in formula (a3) and a diamine in formula (a4). For example, the polyimide may be produced by a method in which a tetracarboxylic acid dianhydride in formula (a3) and a diamine in formula (a4) are mixed and reacted to obtain a polyamic acid, which is then heated or treated with a chemical cyclization agent.

In the production method, the tetracarboxylic acid dianhydride and the diamine may be used in such amounts that the molecular-amount ratio by mole thereof, i.e., tetracarboxylic acid dianhydride: the diamine, may be 1:1.3 to 1:0.85, and is preferably 1:1.25 to 1:0.95. The amounts by mole of the tetracarboxylic acid dianhydride and the diamine are preferably about the same.

A film in the present invention may comprise an inorganic filler, in addition to a resin alloy of a liquid-crystalline polyester and a polyimide.

The inorganic filler may be made from an inorganic compound selected from the group consisting of aluminum borate, potassium titanate, magnesium sulfate, zinc oxide, silicon carbide, silicon nitride, silicon dioxide and aluminum oxide. The inorganic filler may be glass fiber, alumina fiber or the like.

The inorganic filler may have a particle shape with a particle diameter (D) on average of 0.05 to 0.5 μm, a particle length (L) on average of 0.5 to 20 μm and an aspect ratio (L/D) of 4 to 400. Preferably, the aspect ratio (L/D) is 50 to 400.

When the particle diameter and/or the particle length is/are smaller than the above lower limit, the dispersal of the inorganic filler tends to deteriorate. When the particle diameter and/or the particle length is/are larger than the above upper limit, the mechanical strength of the resulting film tends to decrease.

The inorganic filler may be surface-treated with an agent such as a silane coupling agent and then used in the present invention, so that compatibility or adhesion between the inorganic filler and the resin alloy is enhanced.

When the film in the present invention contains an inorganic filler, the amount of the filler to be used may be 100 parts by weight or smaller, and is preferably 40 parts by weight or smaller, per 100 parts by weight of the total weight of the liquid-crystalline polyester and the polyamic acid (that is a precursor of the polyimide contained in the resulting film). When the amount of the filler is larger than the above upper limit, the mechanical strength of the resulting film tends to decrease.

A film in the present invention may be produced by a method comprising the steps of applying a liquid composition comprising a liquid-crystalline polyester, a polyamic acid and an organic solvent on a substrate, removing the solvent and heating the resultant, which may be followed by the step of peeling off the substrate. The liquid composition for applying may contain the above-mentioned optional inorganic filler.

The liquid composition for applying is preferably obtained by mixing a liquid-crystalline polyester with a solution comprising the polyamic acid and an organic solvent, and optionally further mixing the inorganic filler.

The above-mentioned polyamic acid solution may be prepared by mixing a tetracarboxylic acid dianhydride represented by formula (a3) and a diamine represented by formula (a4) in the presence of an organic solvent to react the dianhydride and the diamine. Preferably, the polyamic acid solution is prepared by mixing a solution of the tetracarboxylic acid dianhydride dissolved in an organic solvent and a solution of the diamine dissolved in an organic solvent to react the dianhydride and the diamine.

The reaction of the dianhydride and the diamine for producing a polyamic acid may be conducted at a temperature of 0 to 100° C., and is preferably conducted at a temperature of 10 to 50° C., for 1 to 24 hours. The progress and completion of the reaction can be recognized by an intensity of the characteristic absorption peak of the anhydride in an infrared spectrum (IR) of the reaction mixture.

The mixing of the liquid-crystalline polyester and the polyamic acid solution may be conducted by adding the liquid-crystalline polyester in a solid form into the polyamic acid solution. Preferably, the mixing is conducted by previously dissolving the liquid-crystalline polyester in an organic solvent to prepare a liquid-crystalline polyester solution, which is then mixed with the polyamic acid solution.

The mixing of the liquid-crystalline polyester and the polyamic acid solution may be conducted at a temperature of 0 to 100° C., and is preferably conducted at a temperature of 10 to 50° C., for 1 to 24 hours.

The organic solvent is not limited as long as the liquid-crystalline polyester and the polyamic acid are dissolved therein. Examples of the organic solvent include N,N-dimethylacetamide, N-methylpyrrolidone, N-methylcaprolactam, N,N-dimethylformamide, N,N-diethylformamide, N,N-diethylacetamide, N-methylpropionamido, dimethylsulfoxide, γ-butyl lactone, dimethyl imidazolidinone, tetramethylphospholic amide, ethylcellosolve acetate and a halogenated phenol such as p-chlorophenol.

The organic solvent may be used singly, or may be used independently or in admixture of two or more of them.

The amount of organic solvent to be used may be decided so that the liquid-crystalline polyester and the polyamic acid are dissolved sufficiently. The amount of the organic solvent may be decided so that the total amount of the materials (including the liquid-crystalline polyester and the polyamic acid) to be dissolved, other than the solvent, may be in the range of from 5 to 50% by weight, and is preferably in the range of from 10 to 20% by weight, on the basis of the resulting solution obtained.

When the optional inorganic filler is used, the amount of the organic solvent is preferably decided so that the total amount of the materials other than the solvent may be in the range of from 5 to 50% by weight, and is preferably in the range of from 8 to 35% by weight.

When a film in the present invention is produced using a liquid composition comprising a liquid-crystalline polyester and a polyamic acid, the amounts of the liquid-crystalline polyester and polyamic acid can be decided so that the ratio of the components, i.e., liquid-crystalline polyester: polyamic acid, may be in the range of from 5:95 to 95:5, and is preferably in the range of from 10:90 to 30:70, on the weight basis thereof.

When a film in the present invention is produced using a liquid composition further containing an inorganic filler, the amounts of the liquid-crystalline polyester and polyamic acid can be decided so that the above-mentioned ratio of the components, i.e., liquid-crystalline polyester:the polyamic acid, may be within the above-mentioned range, and also that the ratio of the components to the filler, i.e., the total amounts of liquid-crystalline polyester and polyamic acid: inorganic filler, may be in the range of from 100:1 to 100:100, and is preferably in the range of from 100:1 to 100:40, on the weight basis thereof.

As mentioned above, a film in the present invention may be produced by a method comprising the steps of applying a liquid composition comprising a liquid-crystalline polyester, a polyamic acid and an organic solvent on a substrate, removing the solvent and heating the resultant, which may be followed by the step of peeling off the substrate.

The heating may be carried out at a temperature of from 200 to 450° C. in a nitrogen-gas atmosphere.

In the method, instead of the heating step, the treatment with a chemical cyclization agent may be conducted. The chemical cyclization agent may be a conventional agent which has been used for converting polyamic acid to polyimide. Examples of the chemical cyclization agent include pyridine, acetic acid anhydride and benzoic acid.

A substrate onto which the film of the present invention can be placed may be a glass plate, a conductor layer or the like. Examples of the conductor layer include a plate or foil of metal such as gold, silver, copper, aluminum and nickel. Preferable conductor layer is a copper foil.

After removing foreign matters by filtration, if necessary, the applying of the above-mentioned liquid composition can be conducted by a roller-coat method, a dip-coat method, a spray-coat method, a spinner-coat method, a curtain-coat method, a slot-coat method, a screen printing or the like.

After applying the liquid composition on a substrate, the solvent may be removed by a conventional method such as evaporation of the solvent by heating, applying a reduced pressure, air blowing (ventilation), etc. In particular, the solvent is preferably removed by evaporation by heating, more preferably by evaporation by heating with air blowing.

The liquid composition is preferably predried at a temperature of from 50 to 100° C. for 10 minutes to 2 hours, and then is heated at a temperature of 200 to 450° C. for 30 minutes to 6 hours.

One embodiment of the method for producing a film of the present invention is described below:

A liquid composition comprising a liquid-crystalline polyester, a polyamic acid and an organic solvent (and an optional inorganic filler) is applied onto a glass plate, is dried at a temperature of 80° C. for 1 hour, and then is heated at a temperature of from 200 to 450° C. for several minutes to several hours (preferably, at a temperature of from 250 to 350° C. for one (1) to several hours) in a nitrogen-gas atmosphere so as to prepare a resin alloy of a liquid-crystalline polyester and a polyimide (and an optional inorganic filler), and removing the glass plate off, to obtain a film of the present invention.

The film produced by the method described above may have a thickness of about 5 to 50 μm.

Monomer components providing the film produced by the above method can be analyzed by the following methods:

A film (200 mg) to be analyzed, an n-butylamine (5 ml) and an N-methyl-pyrrolidone (40 ml) are mixed, heated and refluxed to dissolve the film in the mixture. After removing the unreacted n-butylamine, an N-methyl-pyrrolidone is further added thereto in an appropriate amount to prepare a film-dissolving solution (100 ml). Using the film-dissolving solution, qualitative and quantitative analyses of the monomers providing the film are conducted by gas chromatography-mass spectrometry (GCMS) and gas chromatography (GC) with an analytical (working) curve, respectively. Before the analyses, a formic acid (1 ml) may be further added to the film-dissolving solution to raise the accuracy of the analyses.

The qualitative and quantitative analyses are preferably conducted under the following conditions:

[Condition 1 for Qualitative Analysis]
CG device: Agilent 6890 type,
MSD device: 5973N type,
Column: UA-5 (0.25 mm φ×30 m; film thickness: 25 μm),
Interface temperature (pyrolyzer): 320° C.,
Injection mode: split (100:1),
Inlet temperature: 320° C.,
Carrier gas and its flow amount: He, 1 ml/min. (constant-flow mode),
Oven temperature for column: raising the temperature from 50° C. to 350° C. at the rate of 20° C./min. and maintain the temperature of 350° C. for 5 minutes,
Detector: MSD,
Aux temperature: 280° C.,
MS range: 35–550.

[Condition 2 for Quantitative Analysis]
Device: HP5890 series II type,
Column: BPX5 (0.25 mm φ×30 m; film thickness: 25 μm),
Injection mode: split (50:1),
Inlet temperature: 280° C.,
Oven temperature for column: raising the temperature from 50° C. to 350° C. at the rate of 20° C./min. and maintain the temperature of 350° C. for 5 minutes,
Detector: FID,
Aux temperature: 320° C.

In the present invention, a laminate having a conductor layer and a film comprising a resin alloy of a liquid-crystalline polyester and a polyimide is provided. In the laminate, the film may be directly placed on the conductor layer, or may be placed on the conductor layer with an adhesive therebetween.

The laminate in which the adhesive is present between the film and the conductor layer may be produced as follows:

A solution containing an adhesive is applied onto the conductor layer (such as a copper foil) using a coater (such as a reverse roll coater, a comma coater and a die coater) and then is dried at a temperature of from 80 to 120° C. for 3 to 10 minutes to obtain a conductor layer having the adhesive layer with a thickness, for example, of from 10 to 40 μm. The conductor layer having the adhesive layer is placed onto a film of the present invention so that the adhesive layer faces the film, and then is pressed and heated with a roll laminator, and is optionally subjected to a thermal treatment, to sufficiently cure the adhesive layer and to obtain a laminate in which the adhesive is present between the film and the conductor layer. Alternatively, the laminate in the present application may be produced in the same method as above, except that the adhesive is applied onto a film of the present invention, which is then placed onto a conductor layer so that the adhesive layer faces the conductor layer.

The adhesive may be made from an epoxy resin, a phenol resin, a polyester resin, an acrylonitrile-butadiene rubber (NBR), an acryl resin, a polyimide resin or the like.

The laminate in which a film of the present invention is directly placed on a conductor layer, can be produced by a method in which the conductor layer is formed onto the film by a deposition method. Examples of the deposition method include an ion-beam sputtering method, a high-frequency sputtering method, a direct-current sputtering method and a glow discharge method.

In the present invention, a flexible wiring board can be obtained by, for example, a method in which a prescribed circuit is provided using a etching resist on a copper foil in a laminate obtained in the present invention, a portion of the copper foil is dissolved and removed by etching, and then the etching resist is removed to provide a copper circuit, onto which a cover film is laminated. The cover film may be a film of the present invention.

The invention being thus described, it will be apparent that the same may be varied in many ways. Such variations are to be regarded as within the spirit and scope of the invention, and all such modifications as would be apparent to one skilled in the art are intended to be within the scope of the following claims.

The entire disclosure of the Japanese Patent Applications No. 2004-158828 filed on May 28, 2004 and No. 2004-370729 filed on Dec. 22, 2004, including specification, claims and summary, are incorporated herein by reference in their entirety.

EXAMPLES

The present invention is described in more detail by following Examples, which should not be construed as a limitation upon the scope of the present invention.

Production Example 1

A reaction vessel equipped with a stirring blade, a torque meter, a tube for introducing a nitrogen gas, a thermometer and a reflux condenser, was charged with 941 g (5 mol) of 2-hydroxy-6-naphthoic acid, 273 g (2.5 mol) of 4-aminophenol, 415.3 g (2.5 mol) of isophthalic acid and 1123 g (11 mol) of acetic anhydride. After thoroughly purging the interior of the reactor with nitrogen gas, the reactor was heated to 150° C. over 15 minutes while flowing nitrogen gas in the reactor, and then the mixture was refluxed at 150° C. for 3 hours. Thereafter, the reaction mixture was heated to 320° C. over 170 minutes, while evaporating off by-produced acetic acid and unreacted acetic anhydride. When the increase of a torque was recorded, the reaction was regarded as being completed, and the content was discharged from the reactor.

The solid obtained was cooled to room temperature and coarsely milled, and the milled solid was maintained at 250° C. for 3 hours in a nitrogen atmosphere to proceed solid polymerization to obtain a liquid-crystalline polyester powder. When observed by a polarization microscope at a temperature of 350° C., the powder showed a schlieren pattern, which is characteristic of a liquid crystal phase. The portion of the powder (8 g) was added to 92 g of N-methyl-2-pyrrolidone and was heated to a temperature of 120° C., to obtain a transparent solution of the polymer. The solution is hereinafter referred to as Liquid L1.

Production Example 2

A four-neck flask (100 ml) equipped with a tube for introducing a nitrogen gas, a thermometer and a stirring blade was charged with 4.45 g (22.2 mmol) of 4,4'-diaminophenyl ether, into which 106.84 g of N-methyl-2-pyrrolidone was further added. Subsequently, 4.84 g (22.2 mmol) of 1,2,4,5-benzenetetracarboxylic dianhydride was added, and was heated to a temperature of 25° C. and was stirred at the reaction temperature of 25° C. for 15 hours, to obtain a polyamic acid solution in brown with a high viscosity. This solution is hereinafter referred to as Liquid L2.

Production Example 3

A solution of a polyamic acid was obtained in the same manner as in Production example 2, except that the amount of 1,2,4,5-benzenetetracarboxylic dianhydride added was changed from 4.84 g (22.2 mmol) to 3.87 g (17.8 mmol). This solution is hereinafter referred to as Liquid L3.

Example 1

Liquid L1 (25 g) and Liquid L2 (75 g) was mixed at room temperature to obtain a liquid composition.

The liquid composition was casted onto a glass plate using an applicator, was heated and dried at a temperature of 80° C. for one hour. After further heating at a temperature of 350° C. for 5 hours and then cooling to room temperature, the glass plate was removed, to obtain a film in brown, which comprises a resin alloy. The obtained film is hereinafter referred to as Film 1.

Example 2

A film comprising a resin alloy was obtained in the same manner as in Example 1, except that Liquid L3 (75 g) was used instead of using Liquid L2 (75 g), and that the period of time for the heating at a temperature of 350° C. was changed from 5 hours to 2 hours. The obtained film is hereinafter referred to as Film 2.

Example 3

Into a liquid composition obtained in the same manner as in Example 2, 3.2 g of an aluminum borate having a needle shape as an inorganic filler (brand name: Alubolex M20C, manufactured by Shikoku Chemicals Corporation, particle diameter (D) on average: 0.1 μm, particle length (L) on average: 7.5 μm, aspect ratio (L/D): 75) was added and was mixed at room temperature for one hour, to obtain a liquid composition.

The liquid composition was casted in the same manner as in Example 2 to obtain a film comprising a resin alloy. The obtained film is hereinafter referred to as Film 3.

Example 4

Into the liquid composition obtained in the same manner as in Example 2, 3.2 g of the aluminum borate, Alubolex M20C, was added and was mixed at room temperature for one hour, to obtain a liquid composition.

The liquid composition was casted onto a copper foil using an applicator, was heated and dried at a temperature of 80° C. for one hour. After further heating at a temperature of 350° C. for 2 hours, to obtain a laminate. The obtained laminate was flat and did not have a curled shape.

Comparative Example 1

Liquid L1 (30 g) was casted onto a glass plate using a film applicator, was heated and dried at a temperature of 80° C. for one hour. After further heating at a temperature of 350° C. for 5 hours and then cooling to room temperature, the glass plate was removed, to obtain a film of liquid-crystalline polyester. The obtained film is hereinafter referred to as Film 4.

Comparative Example 2

A film of liquid-crystalline polyester was obtained in the same manner as in Comparative Example 1, except that Liquid L2(30 g) was used instead of using Liquid L1 (30 g). The obtained film is hereinafter referred to as Film 5.

Comparative Example 3

A film of polyimide was obtained in the same manner as in Comparative Example 1, except that Liquid L3 (30 g) was used instead of using Liquid L1 (30 g), and that the period of time for the heating at a temperature of 350° C. was changed from 5 hours to 2 hours. The obtained film is hereinafter referred to as Film 6.

Glass transition temperature, tensile modulus and linear expansion coefficient of the above-obtained films were measured by the methods below. The results of the measurements are shown in Table 1.

(1) Glass Transition Temperature (Tg):

Using a viscoelasticity-measuring apparatus (model: DMA2980, manufactured by TA Instruments Co., Ltd), glass transition temperature of film was measured. It is noted that heat resistance of the film measured can be evaluated by the glass transition temperature.

(2) Linear Expansion Coefficient (a):

Using TMA (thermomechanical analysis) apparatus manufactured by Rigaku Corporation, linear expansion coefficient of film was measured in the temperature range of from 50 to 400° C., while raising the temperature at a rate of 5° C./min in nitrogen-gas flow.

(3) Tensile Modulus:

Using an autograph manufactured by Shimazu Corporation, tensile modulus of film was measured in accordance with JIS K 7161.

TABLE 1

| | Glass transition temperature (° C.) | Tensile modulus (MPa) | Linear expansion coefficient ($\times 10^{-6}$/° C.) |
|---|---|---|---|
| Example 1 (Film 1) | 439 | 5100 | 50 |
| Example 2 (Film 2) | 458 | — | 47 |
| Example 3 (Film 3) | 449 | — | 27 |
| Comparative Example 1 (Film 4) | 196 | 3600 | *1 |
| Comparative Example 2 (Film 5) | 407 | 3800 | 132 |
| Comparative Example 3 (Film 6) | 407 | — | 132 |

*1. Linear expansion coefficient of Film 4 was too large to be measured.

What is claimed is:

1. A liquid composition obtained by mixing a solution comprising a liquid-crystalline polyester and an organic solvent, with a solution comprising a polyamic acid and an organic solvent.

2. A method for producing a film comprising a resin alloy of a liquid-crystalline polyester and a polyimide, the method comprising the steps of applying a liquid composition according to claim 1 on a substrate, removing the solvent and heating the resultant.

3. A method according to claim 2 wherein the liquid composition further comprises an inorganic filler.

4. A method according to claim 3, wherein the inorganic filler comprises an inorganic compound which is selected from the group consisting of aluminum borate, potassium titanate, magnesium sulfate, zinc oxide, silicon carbide, silicon nitride, silicon dioxide and aluminum oxide.

5. A method according to claim 3 wherein the inorganic filler is glass fiber and/or alumina fiber.

6. A method for producing a film comprising a resin alloy of a liquid-crystalline polyester and a polyimide, the method comprising the steps of applying a liquid composition according to claim 1 on a substrate, removing the solvent and treating the resultant with a chemical cyclization agent.

7. A liquid composition according to claim 1 wherein the liquid crystalline polyester comprises:

a repeating unit derived from an aromatic hydroxycarboxylic acid, a repeating unit derived from an aromatic dicarboxylic acid and a repeating unit derived from an aromatic diol; or a repeating unit derived from an aromatic hydroxycarboxylic acid, a repeating unit derived from an aromatic dicarboxylic acid and a repeating unit derived from an aromatic amine with a phenolic hydroxyl group.

8. A liquid composition according to claim 7, wherein the repeating unit derived from an aromatic hydroxycarboxylic acid is at least one unit selected from the group consisting of the units represented by formulas ($A_1$) and ($A_3$) below:

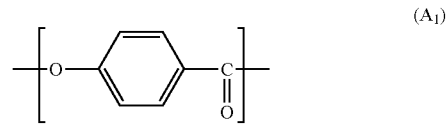

(A1)

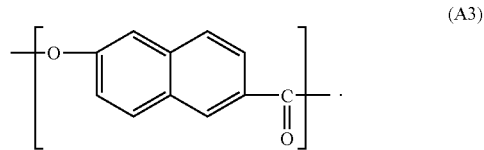

(A3)

9. A liquid composition according to claim 7, wherein the repeating unit derived from an aromatic dicarboxylic acid is at least one unit selected from the group consisting of the units represented by formulas ($B_1$), ($B_2$) and ($B_3$) below:

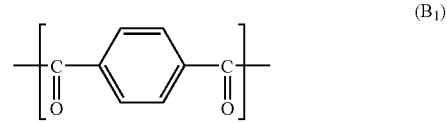

(B1)

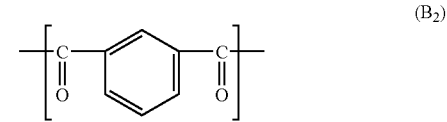

(B2)

-continued

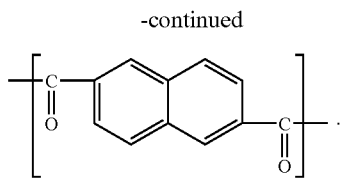
(B₃)

10. A liquid composition according to claim 7, wherein the liquid-crystalline polyester comprises a repeating unit derived from an aromatic hydroxycarboxylic acid, a repeating unit derived from an aromatic dicarboxylic acid and a repeating unit derived from an aromatic amine with a phenolic hydroxyl group, the aromatic amine being selected from the group consisting of the units represented by formulas (D₁) and (D₂) below:

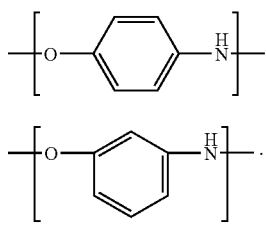
(D₁)

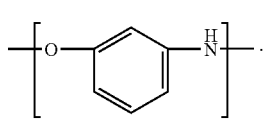
(D₂)

11. A liquid composition according to claim 7, wherein the liquid-crystalline polyester comprises repeating units represented by combinations (a)-1 to (a)-7 below:
- (a)-1: a combination of formulas (A₁), (B₂) and (D₁),
- (a)-2: a combination of formulas (A₃), (B₂) and (D₁),
- (a)-3: a combination of formulas (A₁), (B₂), (B₂) and (D₁),
- (a)-4: a combination of formulas (A₃), (B₁), (B₂) and (D₁),
- (a)-5: a combination of formulas (A₃), (B₃) and (D₁),
- (a)-6: a combination of formulas (B₁), (B₂) and (D₁), and
- (a)-7: a combination of formulas (B₁), (B₃) and (D₁);

wherein formulas (A₁), (A₃), (B₁), (B₂), (B₃) and (D₁) are provided below:

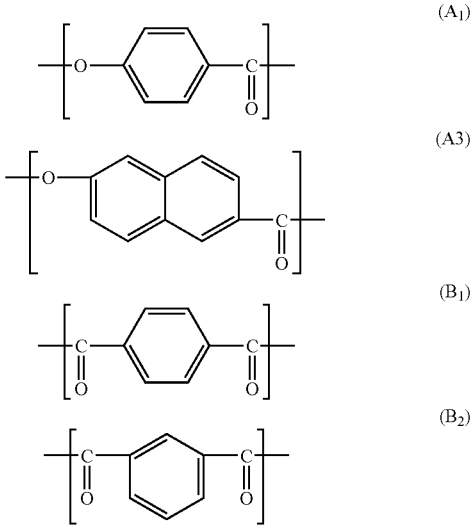

-continued

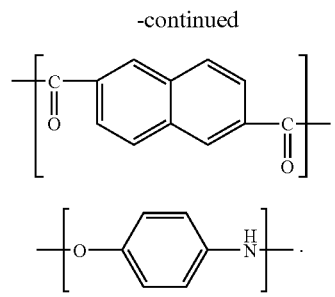
(B₃)

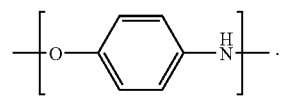
(D₁)

12. A liquid composition according to claim 11 wherein a part or all of (D₁) in each combination selected from combinations (a)-1 to (a)-7 is replaced by (E₁) or (E₅) below:

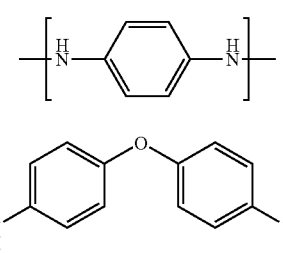
(E₁)

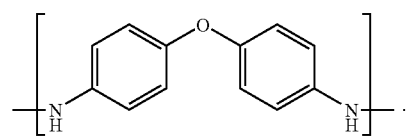
(E₅)

13. A liquid composition according to claim 1 wherein the liquid-crystalline polyester comprises 30 to 80% by mole of a repeating unit derived from at least one compound selected from the group consisting of p-hydroxybenzoic acid and 2-hydroxy-6-naphthoic acid, 10 to 35% by mole of a repeating unit derived from at least one compound selected from the group consisting of 4-hydroxy aniline and 4,4'-diaminodiphenylether and 10 to 35% by mole of a repeating unit derived from at least one compound selected from the group consisting of terephthalic acid and isophthalic acid.

14. A liquid composition according to claim 1 wherein the liquid-crystalline polyester comprises:
- a repeating unit derived from an aromatic hydroxycarboxylic acid, a repeating unit derived from an aromatic dicarboxylic acid and a repeating unit derived from an aromatic diamine; or
- a repeating unit derived from an aromatic dicarboxylic acid and a repeating unit derived from an aromatic diamine.

15. A liquid composition according to claim 14 wherein the repeating unit derived from an aromatic diamine is at least one unit selected from the group consisting of the units represented by formulas (E₁) and (E₅) below:

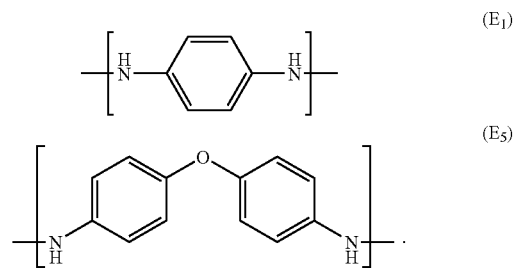

* * * * *